(12) United States Patent
Raettich et al.

(10) Patent No.: US 11,691,361 B2
(45) Date of Patent: Jul. 4, 2023

(54) METHOD FOR PRODUCING A COMPONENT, IN PARTICULAR FOR A MOTOR VEHICLE, AND COMPONENT

(71) Applicant: Bayerische Motoren Werke Aktiengesellschaft, Munich (DE)

(72) Inventors: Philip Raettich, Bidingen (DE); Matthias Wagner, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 507 days.

(21) Appl. No.: 16/773,761

(22) Filed: Jan. 27, 2020

(65) Prior Publication Data
US 2020/0161601 A1    May 21, 2020

Related U.S. Application Data

(63) Continuation of application No. PCT/EP2018/068194, filed on Jul. 5, 2018.

(30) Foreign Application Priority Data

Jul. 28, 2017  (DE) .................... 10 2017 213 023.7

(51) Int. Cl.
    *B29C 70/46*    (2006.01)
    *B29C 70/88*    (2006.01)
    (Continued)

(52) U.S. Cl.
    CPC ............ *B29C 70/885* (2013.01); *B22D 19/00* (2013.01); *B22D 21/027* (2013.01); *B29C 70/46* (2013.01);
    (Continued)

(58) Field of Classification Search
    CPC ..... B29C 70/46; B29C 43/02; B29K 2067/06; B29K 2105/12; B29K 2105/16; B29K 2309/08; B29K 2509/00; B29L 2031/3468
    (Continued)

(56) References Cited

U.S. PATENT DOCUMENTS 5,371,404 A     12/1994 Juskey et al.
2006/0076712 A1  4/2006 Yonemochi et al.
(Continued)

FOREIGN PATENT DOCUMENTS

CA    2020624 A1    1/1991
CN    101998817 A   3/2011
(Continued)

OTHER PUBLICATIONS

PCT/EP2018/068194, International Search Report dated Oct. 25, 2018 (Two (2) pages).
(Continued)

*Primary Examiner* — Jeffrey M Wollschlager
*Assistant Examiner* — Xue H Liu
(74) *Attorney, Agent, or Firm* — Crowell & Moring LLP

(57) ABSTRACT

A method for producing a component includes incorporating a molding compound into a tool for producing the component, where the molding compound includes an artificial resin as a matrix and a filler material embedded in the matrix. The method includes compressing the molding compound by the tool and by the compressing forming the molding compound to a green product. The method further includes providing the green product while disposed in the tool with a layer in a sub-region by incorporating a liquid material for producing the layer into the tool and applying the liquid material to the sub-region. The liquid material is
(Continued)

a metallic material and the layer is an electromagnetic shielding on the green product.

16 Claims, 1 Drawing Sheet

(51) Int. Cl.

| | | |
|---|---|---|
| B22D 19/00 | (2006.01) | |
| B22D 21/02 | (2006.01) | |
| H05K 9/00 | (2006.01) | |
| H01M 50/124 | (2021.01) | |
| H01M 50/10 | (2021.01) | |
| H01M 50/103 | (2021.01) | |
| B29C 43/02 | (2006.01) | |
| B29K 67/00 | (2006.01) | |
| B29K 105/12 | (2006.01) | |
| B29K 105/16 | (2006.01) | |
| B29K 309/08 | (2006.01) | |
| B29K 509/00 | (2006.01) | |
| B29L 31/34 | (2006.01) | |

(52) U.S. Cl.
CPC ......... *H01M 50/10* (2021.01); *H01M 50/103* (2021.01); *H01M 50/124* (2021.01); *H01M 50/1245* (2021.01); *H05K 9/0045* (2013.01); *H05K 9/0084* (2013.01); *B29C 43/02* (2013.01); *B29K 2067/06* (2013.01); *B29K 2105/12* (2013.01); *B29K 2105/16* (2013.01); *B29K 2309/08* (2013.01); *B29K 2509/00* (2013.01); *B29L 2031/3468* (2013.01); *H01M 2220/20* (2013.01)

(58) Field of Classification Search
USPC ......................................................... 264/129
See application file for complete search history.

(56) References Cited

U.S. PATENT DOCUMENTS

2013/0082885 A1 4/2013 Chang
2017/0136714 A1* 5/2017 Eschl .................... B29C 70/345

FOREIGN PATENT DOCUMENTS

| | | |
|---|---|---|
| CN | 102148063 A | 8/2011 |
| CN | 106170385 A | 11/2016 |
| CN | 106671501 A | 5/2017 |
| DE | 39 22 477 A1 | 1/1991 |
| DE | 694 28 684 T2 | 8/2002 |
| DE | 10 2007 030 861 A1 | 12/2008 |
| DE | 10 2010 809 244 A1 | 10/2011 |
| DE | 10 2014 018 649 A1 | 6/2015 |
| EP | 2 374 826 A1 | 10/2011 |
| EP | 2 853 321 A1 | 4/2015 |
| JP | 60-217121 A | 10/1985 |
| JP | 61-295347 A | 12/1986 |
| JP | 63-257298 A | 10/1988 |
| JP | 10-166384 A | 6/1998 |
| JP | 2013-209510 A | 10/2013 |

OTHER PUBLICATIONS

German-language German Office Action issued in German counterpart application No. 10 2017 213 023.7 dated Dec. 11, 2018 (Four (4) pages).
English-language Chinese Office Action issued in Chinese application No. 201880037009.6 dated Feb. 3, 2021 (Eight (8) pages).
English machine translation of B10, which was previously cited on Jan. 27, 2020 (Three (3) pages).
Chinese Office Action issued in Chinese application No. 201880037009.6 dated Jan. 17, 2022, with English translation (Sixteen (16) pages).
Peian Jiang, "Design for Manufacturability of Printed Circuit Board", *China Electric Power Press*, Sep. 30, 2007, Chinese-language (Three (3) pages).
English-language Chinese Office Action issued in Chinese application No. 201880037009.6 dated Sep. 18, 2021 (Seven (7) pages).

* cited by examiner

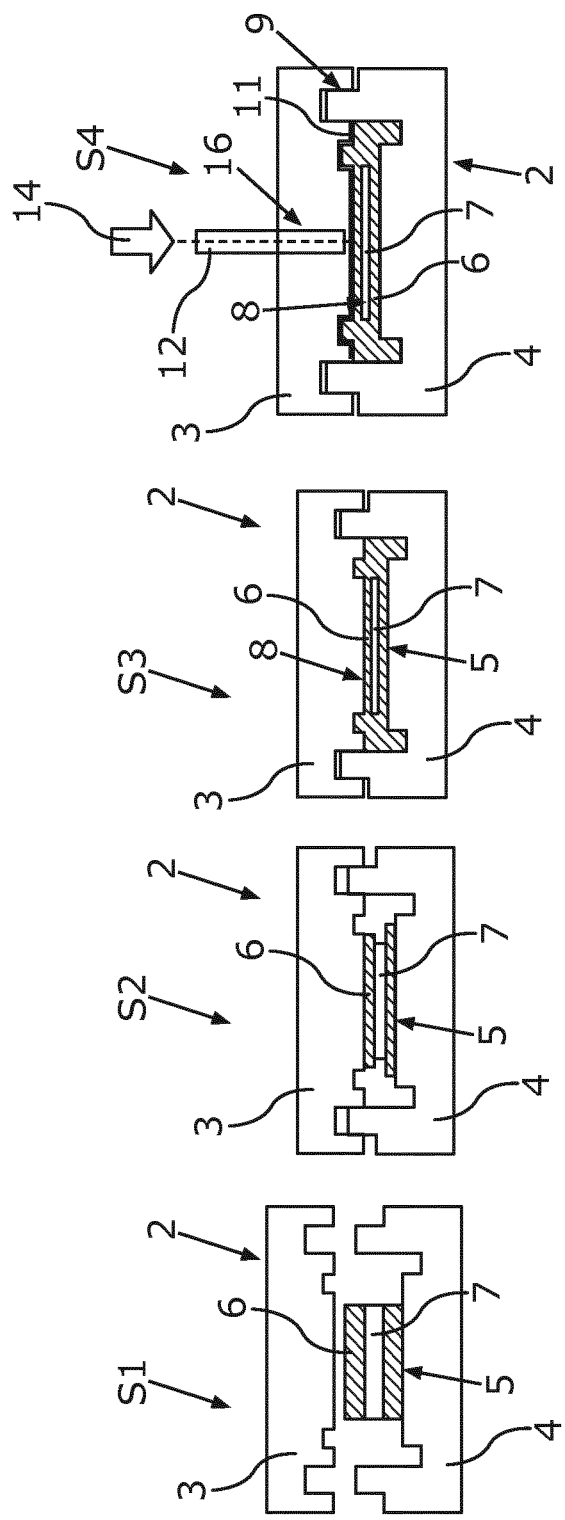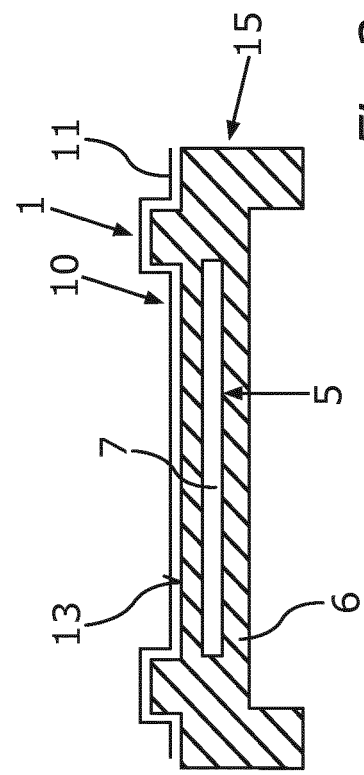

METHOD FOR PRODUCING A COMPONENT, IN PARTICULAR FOR A MOTOR VEHICLE, AND COMPONENT

CROSS REFERENCE TO RELATED APPLICATIONS

This application is a continuation of PCT International Application No. PCT/EP2018/068194, filed Jul. 5, 2018, which claims priority under 35 U.S.C. § 119 from German Patent Application No. 10 2017 213 023.7, filed Jul. 28, 2017, the entire disclosures of which are herein expressly incorporated by reference.

BACKGROUND AND SUMMARY OF THE INVENTION

The invention relates to a method for producing a component, in particular for a motor vehicle, and the invention furthermore relates to a component.

Such a method for producing a component, in particular for a motor vehicle, is already known, for example from EP 2 374 826 A1. In the method, a molding compound for producing the component is incorporated into a tool. The molding compound herein comprises at least one artificial resin as a matrix, or as a plastics material matrix, respectively. Moreover, the molding compound comprises at least one filler material which is embedded in the matrix, or which is received in the matrix, respectively. Once the molding compound has been incorporated into the tool, the molding compound by means of the tool is compressed and on account thereof formed to a green product.

Furthermore, the molding compound, in particular the green product, at least in a sub-region is provided with at least one layer in that while the molding compound, in particular the green product, is situated in the tool, in that a liquid material for producing the layer is incorporated, in particular injected, into the tool and is applied to at least the sub-region, in particular injected onto at least the sub-region. The initially liquid material, for example, thereafter cures such that the initially liquid material solidifies and on account thereof forms the layer which per se is solid, for example.

It is an object of the present invention to refine a method and a component of the type mentioned at the outset such that particularly advantageous properties of the component can be implemented in a particularly cost-effective manner.

In the method according to the invention for producing a component, in particular for a motor vehicle, a molding compound for producing the component is incorporated into a tool, in particular in a molding tool. The molding compound herein comprises at least one artificial resin as a matrix, that is to say as a plastics material matrix. The molding compound furthermore comprises at least one filler material which is embedded in the matrix, or is received in the matrix, respectively. Once the molding compound has been incorporated into the tool, the molding compound that has been incorporated into the tool and is thus situated in the tool is compressed by means of the tool, and on account thereof formed to a green product. The molding compound, in particular once the molding compound has been formed to the green product, in at least one sub-region is provided with at least one layer in that while the molding compound, in particular the green product, is situated in the tool a liquid material for producing the layer is incorporated, in particular injected, into the tool and is applied to at least the sub-region, in particular injected onto at least the sub-region.

In other words, the molding compound situated in the tool is provided with the layer prior to the molding compound being formed, and/or while being formed, and/or after being formed, for example. It is in particular provided that the green product is provided with the layer such that the molding compound is provided with the layer while the molding compound is being formed and/or has been formed to the green product in that the liquid material is incorporated, in particular injected, into the tool and is applied to at least the sub-region, in particular injected onto at least the sub-region.

It is preferably provided that the material is incorporated, in particular injected, into the tool in the liquid state and is applied at least to the sub-region, in particular injected onto at least the sub-region, without the molding compound, or the green product respectively, being retrieved from the tool after the molding compound has been formed and before the material has been incorporated, or injected, respectively, into the tool. In other words, a retrieval of the molding compound from the mold is not undertaken after the molding compound has been formed to the green product and before the material is incorporated into the tool, such that the molding compound after the molding compound has been formed to the green product remains in the tool and is provided with the initially liquid material at least in the sub-region. The initially liquid material, for example, can subsequently cure, on account of which the initially liquid material solidifies. The cured material, on account thereof, forms the layer which is solid per se or has an inherent rigidity, for example.

In order for particularly advantageous properties of the component to now be able to be implemented in a particularly cost-effective manner, it is provided according to the invention that a metallic material from which the layer is produced as an at least substantially homogenous layer for electromagnetic shielding is used as the material. The material in the liquid state thereof in which the material is incorporated into the tool and is applied to at least the sub-region is thus, for example, a melt, or a metallic melt, respectively, which can also be referred to as a metal melt. The metal melt is incorporated into the tool and is applied to at least the sub-region, on account of which the molding compound, in particular the green product, is provided with a metallic material at least in the sub-region. The metal melt subsequently cures, for example, and thus forms the layer which is solid per se or has an inherent rigidity, for example, as a metallic layer which, for example, has only a minor thickness, for example in a range of approximately 3 μm to approximately 2 to 3 mm, and thus can also be referred to as a film.

The metallic layer is electrically conductive or conducting, respectively, and thus forms an electromagnetic shielding by means of which electric and/or magnetic fields are kept away from the component or from the interior of the latter, respectively, or vice versa so as to protect the environment of the component from electric and/or magnetic fields, in particular from the component.

On account of the metallic material being used as the material, a particularly advantageous electromagnetic screening effect or shielding effect, respectively, of the layer can be implemented such that a particularly advantageous electromagnetic compatibility of the component can be implemented. Furthermore, the component can be provided in a particularly simple and cost-effective manner with this shielding since the molding compound, or the green product, respectively, is provided with the layer while the molding compound, in particular upon being formed, is situated in the tool.

The tool has, for example, at least one cavity in which the molding compound is incorporated. The molding compound by means of this cavity is formed to the green product, for example, wherein the liquid material is incorporated, in particular injected, into the cavity and on account thereof is incorporated on the molding compound situated in the cavity, or on the green product, respectively, in particular is injected onto the molding compound situated in the cavity, or onto the green product, respectively.

The component can particularly advantageously be used as a housing for current-conducting components such as, for example, an energy accumulator for accumulating electrical current, in particular a high-voltage accumulator, since the weight and the costs of the housing can be kept particularly low on account of the housing being in particular largely produced from the molding compound. Since the mentioned metallic material is furthermore used as the material for implementing the electromagnetic shielding, a particularly advantageous electromagnetic compatibility of the housing can be realized in a simple and cost-effective manner. The molding compound which per se is non-metallic has no or only a very minor screening effect for implementing an electromagnetic shielding. Such a shielding can now however be implemented in a particularly simple and cost-effective manner by using the metallic material.

The invention herein is in particular based on the concept that a high complexity is currently undertaken, in particular in the development of vehicles, in order for per se non-metallic housings of current-conducting components to be subsequently upgraded, that is to say after the production of the housings, with the aid of various measures so as to be able to implement a sufficient electromagnetic compatibility. Non-metallic material such as, for example, plastics materials and, for example, the afore-mentioned molding compound do not have any electromagnetic screening effect whatsoever, but often are used for producing housings and housing components since such plastics materials can be formed in a particularly advantageous, simple, cost-effective manner. On account thereof, such housings and housing components can be produced in a cost-effective manner, for example.

In order for a desired screening effect to nevertheless be reached, the respective housing configured as a plastics-material housing, for example, after the actual production thereof, and thus subsequently, is equipped with a metallic screen which comprises, for example, an aluminum foil having a thickness of 0.2 millimeters. Furthermore, it is conceivable for the already produced housing to subsequently be painted with an electrically conductive lacquer so as to on account thereof implement a screening effect. In other words, subsequent methods by means of which already produced housings are processed so as to subsequently equip the housings with a screening effect are provided. The subsequent methods for achieving a desired screening effect are in most instances complex and cost intensive. For example, when applying aluminum foils to plastics-material components, adhesive systems having an upstream surface treatment often have to be used, this resulting in a high production complexity. Moreover, additional installation space is required here since the aluminum foil can be folded onto itself up to several millimeters, at least at some locations. Operational safety measures of the highest order are required when painting plastics-material components with electrically conductive lacquer. Moreover, such a lacquer is very cost intensive, this likewise resulting in very high production costs.

The afore-mentioned issues and disadvantages can now be avoided by means of the method according to the invention, wherein a particularly advantageous screening effect can simultaneously be implemented. Since the molding compound, or the green product, respectively, is provided with the metallic material and thus with the layer within the tool, additional process steps can be dispensed with in comparison to conventional methods with downstream processes. The installation space requirement of the completed component comprising at least the molding compound and the layer, can also be kept particularly low.

For example, a sheet molding compound (SMC) method is carried out for molding and forming the molding compound, such that an SMC material is used as the molding compound, for example. For example, the component configured in particular as a housing or a housing component is thus produced from an SMC or from an SMC material, respectively.

For example, the liquid material is incorporated, in particular injected, into the tool and applied at least to the sub-region, in particular injected onto at least the sub-region directly in the molding process and thus, for example, before and/or after the molding compound has been formed to the green product, on account of which the material in the liquid state is applied at least to the sub-region. In the context of the method according to the invention, an in mold coating (IMC) method is thus carried out additionally to the SMC method, for example. The IMC method is in particular distinguished in that the molding compound incorporated into the tool and situated in the tool is provided with the layer while the molding compound is situated in the tool, wherein the molding compound after being incorporated into the tool and before the molding compound being provided with the layer is not retrieved from the tool. In other words, a retrieval of the molding compound after incorporating the molding compound in the tool and before providing the molding compound with the layer does not take place. The molding compound, once the molding compound has been incorporated into the tool, is thus retrieved from the tool for the first time once the molding compound, in particular the green product, has been provided with the layer in the manner described, for example.

It has been demonstrated to be particularly advantageous for pure metal to be used as the metallic material. This is in particular to be understood that the metallic material has a purity of more than 95%, in particular more than 99%, such that the metallic material has precisely one metal, the proportion of the latter in the metallic material being in total more than 95%, in particular more than 99%. The respective percentage indication is in particular to be understood as percentage by weight or percentage by volume.

Particularly advantageous properties, in particular a particularly advantageous screening effect, can in particular be implemented in that tin, in particular pure tin, is used as the pure metal.

In the case of one further embodiment it is provided that the metallic material is initially mixed with at least one auxiliary material which is dissimilar to the metallic material and which in and/or after solidification of the initially liquid metallic material evaporates therefrom. On account thereof, particularly advantageous properties, in particular flow properties, of the metallic material can be implemented, for example, such that the initially liquid metallic material can be particularly readily processed, in particular applied to the molding compound. A flux agent is used as the auxiliary material, for example. The auxiliary material evaporates or is released, respectively, from the metallic material after and/or in the solidification of the initially volatile metallic material, so as to on account thereof implement, for example, a particularly positive screening effect and/or adhesion of the material on the molding compound.

The metallic material and the auxiliary material form, for example, an alloy or a mixture, the auxiliary material having a low-percentage proportion therein. For example, the proportion of the auxiliary material in the mixture is in particular less than ten percent by weight or by volume, in particular less than five and preferably less than three percent by weight or by volume. It is in particular conceivable that the pure metal which is mixed with the auxiliary material is used, in particular exclusively, as the metallic material. The metallic material, or the, in particular precisely, one pure metal, respectively, is in particular provided or mixed, respectively, with a low-percentage proportion of auxiliary materials which are released or evaporate, respectively, from the pure metal in and/or after the solidification.

It has been demonstrated to be particularly advantageous for the layer to be formed exclusively from the metallic material. In other words, the layer is not produced, for instance, as an organic layer having metallic filler materials, but the layer is rather produced from a metal and thus from an inorganic material. The layer is thus, for example, a thin film which is formed from an at least substantially homogenous layer of metal, in particular tin. The use of tin has been demonstrated to be particularly advantageous in combination with an SMC material such that a particularly advantageous screening effect can be implemented in a particularly simple and thus cost-effective manner. No resins or filler materials, but preferably only the pure metallic material, in particular pure tin, is used in the production of the layer. Providing at least the sub-region with the metallic material and thus with the layer is thus carried out, for example, as a metallic casting method, or in the manner of a metallic casting method, respectively, since the metallic material is applied to at least the sub-region.

In order for the method to be able to be carried out in a particularly time-effective and cost-effective manner, at least one infeed duct, in particular an injection duct, of the tool that in the incorporation of the material is capable of being passed through by a flow of material is heated to a temperature which is higher than 200 degrees Celsius, in particular higher than 230 degrees Celsius.

One further embodiment is distinguished in that the material is incorporated into the tool in a liquid state of the material at a pressure which is in a range from 150 bar inclusive to 1500 bar inclusive. On account thereof, the method can be carried out in a particularly time-effective and thus cost-effective manner.

For example, tin has a melting point of 232 degrees Celsius. Respective SMC materials, or molding compounds, respectively, can have a dimensional stability up to 230 degrees Celsius. Process parameters for carrying out the method are now set such, for example, that the SMC material, or the molding compound, respectively, does not suffer any damage on account of the melt that is incorporated and is in particular configured as a tin melt, and that the temperature of the melt, of the molding compound, as well of the tool prevents any undesirable premature solidification of the initially liquid material. The melt is to be completely distributed in the sub-region, or on a surface of the molding compound, respectively, and to solidify only thereafter so as to guarantee, for example, an at least substantially uniform, or homogenous, respectively, thickness of the layer.

In order to implement particularly advantageous properties of the component, a thermosetting artificial resin is preferably used as the plastics material resin. It has been demonstrated to be particularly advantageous for an unsaturated polyester resin (UP) to be used as the artificial resin.

In order to be able to implement particularly advantageous properties of the completed component, it is provided in one further design embodiment of the invention that the filler material comprises reinforcement fibers, in particular glass fibers. The overall proportion of the reinforcement fibers in the molding compound herein is, for example, in a range from 0 percent inclusive to 40 percent inclusive.

One further embodiment is distinguished in that the filler material comprises at least one mineral filler material, in particular chalk and/or rock flour.

In order to herein be able to implement particularly advantageous properties of the component, it has been demonstrated to be particularly advantageous for the overall proportion of the mineral filler material in the molding compound to be in a range from 15 percent inclusive to 45 percent inclusive. The respective percentage indication of the respective proportion is in particular to be understood to be percentage by volume or percentage by weight.

In one particular advantageous design embodiment of the invention, the molding compound by means of the tool is compressed and on account thereof formed at a temperature which is in a range from 100 degrees Celsius inclusive to 180 degrees Celsius inclusive, in particular in a range from 130 degrees Celsius inclusive to 160 degrees Celsius inclusive. In other words, the molding compound while being formed by means of the tool has a temperature, for example, in a range from 130 degrees Celsius inclusive to 160 degrees Celsius inclusive.

Finally, for carrying out a particularly cost-effective method it has been demonstrated to be advantageous for the molding compound by means of the tool to be compressed and on account thereof formed at a pressure prevailing in the tool, in particular in the mentioned cavity, and acting on the molding compound which is in a range from 70 bar inclusive to 160 bar inclusive. The pressure is also referred to as the processing pressure. The processing pressure which is also referred to as the compressive pressure is preferably approximately 100 bar.

A further aspect of the invention is a component, in particular for a motor vehicle, having at least one main body which is formed from a molding compound comprising at least one artificial resin as a matrix and at least one filler material embedded in the matrix, the molding compound by means of a tool being compressed and on account thereof formed to a green product, or to the main body, respectively. The component furthermore has at least one layer which is applied to at least one sub-region of the main body and is formed from an initially liquid material and is produced conjointly with the main body in the tool.

In order to now be able to implement particularly advantageous properties of the component in a particularly cost-effective manner, it is provided according to the invention that the material is a metallic material from which the layer is produced as a homogenous layer for electromagnetic shielding. Advantages and advantageous design embodiments of the method according to the invention are to be considered advantages and advantageous design embodiments of the component according to the invention, and vice versa.

Further details of the invention are derived from the description hereunder of a preferred exemplary embodiment and the appended drawings.

Other objects, advantages and novel features of the present invention will become apparent from the following detailed description of one or more preferred embodiments when considered in conjunction with the accompanying drawings.

BRIEF DESCRIPTION OF THE DRAWINGS

FIG. 1 shows a schematic illustration of a method according to the invention for producing a component, in particular for a motor vehicle; and FIG. 2 shows a schematic sectional view of the component produced.

DETAILED DESCRIPTION OF THE DRAWINGS

Identical or functionally identical elements in the figures are provided with the same reference signs.

FIG. 1 in a schematic illustration shows a method for producing a component 1, in particular for a motor vehicle, the component 1 being shown in a schematic sectional view in FIG. 2. The component 1 is, for example, a housing or a housing component of a housing, wherein the housing is, for example, a housing of an energy accumulator. The energy accumulator is configured for storing electric energy or electrical current, respectively, wherein the energy accumulator has, for example, an electric voltage, in particular an electric operating voltage, of more than 50 Volts, in particular of more than 60 Volts. The energy accumulator is in particular configured as a high-voltage accumulator, in particular as a high-voltage battery (HV battery) such that the energy accumulator has an electric voltage, for example, in particular an electric operating voltage, of several 100 Volts. The energy accumulator and thus the component 1 are used, for example, in a motor vehicle which in the completed state comprises the energy accumulator and thus the component 1 and at least one electric machine. At least one wheel of the motor vehicle, or the motor vehicle overall, herein, is capable of being driven by means of the electric machine, for example. To this end, the electric machine is operated in a motor mode and thus as an electric motor. In order for the electric machine to be operated in the motor mode, the electric machine is supplied with electric energy stored in the energy accumulator.

As will be explained in yet more detail hereunder, particularly advantageous properties of the component 1 and thus of the housing overall can be implemented in a particularly cost-effective manner by means of the method visualized by way of FIG. 1. A particularly advantageous electromagnetic compatibility can in particular be implemented in a cost-effective manner.

A tool 2, also referred to as a molding tool, which has at least two mutually opposite tool halves 3 and 4 is utilized for carrying out the method. The tool halves 3 and 4 are movable, in particular in a translatory manner, relative to one another and can be moved away from one another and toward one another.

In a first step S1 of the method, the tool halves 3 and 4 are moved away from one another and thus opened such that the tool 2 overall is opened. In the first step S1 of the method, a molding compound 5 for producing the component 1 is incorporated into the tool 2 and herein between the tool halves 3 and 4, in particular while the tool 2 is opened, that is to say while the tool halves 3 and 4 are moved away from one another, or are moved apart. The molding compound 5 herein comprises at least one artificial resin 6 as a matrix, in particular as a plastics material matrix, the artificial resin 6 being illustrated in a particularly schematic manner in FIGS. 1 and 2. Furthermore, the molding compound 5 comprises at least one filler material 7 which is embedded in the matrix (artificial resin 6). The artificial resin 6 is, for example, a vinylester or a polyester resin. The artificial resin 6 is in particular, for example, a thermosetting artificial resin, in particular an unsaturated polyester resin (UP). The filler material 7 herein can comprise reinforcement fibers, in particular glass fibers, at a proportion from 0 percent to 40 percent, and/or a mineral filler material such as, for example, chalk and/or rock flour, in particular at a proportion from 15 to 45 percent. The molding compound 5 is also referred to as an SMC material or as SMC, and in the context of an SMC method to be explained in yet more detail hereunder herein is compressed and formed. The tool 2, in particular the tool halves 3 and 4, are heated, for example in particular before the molding compound 5 is incorporated into the tool 2 and/or while the molding compound 5 is situated in the tool 2, and herein heated, or rapidly heated, respectively, to, for example, 150 degrees Celsius such that, for example, the molding compound 5 is heated or rapidly heated, respectively, by means of the heated tool 2. The molding compound 5, in particular by means of the tool 2 and thus, for example, while the molding compound 5 is situated in the tool 2 and in particular before the molding compound 5 is formed by means of the tool 2, is in particular heated to a temperature which is in a range from 130 degrees Celsius inclusive to 160 degrees Celsius inclusive.

In a second step S2 of the method, the tool 2 is closed in that the tool halves 3 and 4 are moved toward one another, or moved together, respectively. The tool 2 is also referred to as a mold which closes in the second step S2. The tool 2 herein has a cavity 8 which is formed or delimited, respectively, by the tool halves 3 and 4 in particular in the closed state of the tool 2, or of the tool halves 3 and 4, respectively. The molding compound 5 herein is situated in the cavity 8 and is formed by means of the latter, in particular in that the molding compound 5 hugs in particular respective contours of the tool halves 3 and 4 that delimit the cavity 8 and tool halves 3 and 4. On account of the tool halves 3 and 4, or the tool 2, respectively, being closed, the molding compound 5 is molded on account of which the molding compound 5, for example in a third step S3, fills the cavity 8. On account thereof, the molding compound 5 is molded and, on account thereof, formed to a green product 9 which is situated in the cavity 8.

The molding compound 5, or the green product 9, respectively, starts to cure in the closed tool 2, for example at a pressure of approximately 100 bar prevailing in the cavity 8 and at a temperature of 150 degrees Celsius prevailing in the cavity 8. In other words, the molding compound 5 is molded and on account thereof is formed, for example, by means of the tool 2 at a pressure prevailing in the tool 2, in particular in the cavity 8 and acting on the molding compound 5, the pressure being in a range from 70 bar inclusive to 130 bar inclusive. Alternatively or additionally, the molding compound 5 situated in the cavity 8 cures in the tool 2 at the pressure mentioned.

In a fourth step S4 of the method, the molding compound 5, in particular the green product 9, is provided with at least one layer 11 at least in a sub-region 10 in that a liquid material 12 for producing the layer 11 is incorporated, in particular injected, into the tool 2, in particular into the cavity 8 and is applied to at least the sub-region 10, in particular injected onto the sub-region 10, while the molding compound 5, in particular the green product 9 is situated in the tool 2 and herein between the tool halves 3 and 4. On account thereof, the initially liquid material 12 is applied to the sub-region 10 and thus to the molding compound 5, in particular to the green product 9. The material 12 is in particular injected into the tool 2 and injected onto the sub-region 10 before the molding compound 5 has completely cured. The material 12 is preferably injected into the tool 2, in particular into the cavity 8, at a high pressure. For example, the material 12 is injected into the tool 2, in particular into the cavity 8, at a pressure which is also referred to as the injection pressure and is higher than 100 bar. The injection pressure preferably is in a range from 150 bar inclusive to 1500 bar inclusive.

The tool 2 under the influence of the injection pressure opens somewhat, on account of which the layer 11 can be particularly advantageously distributed on the molding compound 5, in particular on the green product 9, and herein on a surface 13 of the molding compound 5 or of the green product 9, respectively, and a particularly advantageous adhesion of the material 12, or of the layer 11, respectively, on the still fresh, or not yet completely cured, respectively, molding compound 5 can be implemented.

In order for particularly advantageous properties of the component 1 to now be able to be implemented in a particularly cost-effective manner, a metallic material is used as the material 12 from which the layer 11 is produced as an at least substantially homogenous layer for electromagnetic shielding. In other words, the layer 11 forms an electromagnetic shielding effect such that a particularly advantageous electromagnetic compatibility of the component 1 can be implemented. To this end, the layer 11 is formed from the metallic and electrically conductive, or conducting, respectively, material 12.

In the case of the exemplary embodiment visualized in FIGS. 1 and 2, a pure metal in the form of pure tin is used as the metallic material. The tin is injected into the tool 2, in particular into the cavity 8, and injected onto the sub-region 10 in liquid form and thus as a melt, that is to say as a tin melt. Tin herein has a melting point of 232 degrees Celsius. Such a molding compound, or such an SMC material which has a dimensional stability up to 230 degrees Celsius is in particular used as the molding compound 5. Process parameters for carrying out the method are now set such that the molding compound 5 (SMC material) does not suffer any damage on account of the injected tin melt, and that the temperature of the tin melt, of the molding compound 5, as well as of the tool halves 3 and 4 prevents any undesirable premature solidification of the tin and thus of the layer 11. On account thereof, the tin melt is distributed in an at least substantially complete manner on the surface 13 and solidifies only thereafter. After the fourth step S4 in which the tool 2 is closed and the material 12 is injected into the cavity 8, as is visualized by an arrow 14 in FIG. 1, the tool 2 can be opened in that the tool halves 3 and 4 are moved apart. Thereafter, the component 1 having the layer 11 can be retrieved from the tool 2. The layer 11 herein is an EMC shielding which is fixedly anchored to the molding compound 5. The molding compound 5, or the green product 9, respectively, forms a main body 15 of the component 1, wherein the main body 15 is provided with the layer 11.

It can be seen overall that the molding compound 5, after being incorporated into the tool 2 and before the material 12 is injected, is not retrieved from the tool 2 such that the tool 2 also referred to as a mold or functioning as a mold, respectively, continues to remain closed after the forming of the molding compound 5, in particular during a dwell time which is in particular a function of the wall thickness and the reaction temperature in particular of the molding compound 5.

The material 12 is injected into the tool 2, in particular into the cavity 8 by way of at least one or a plurality of infeed ducts in the form of injection ducts 16 of the tool 2, in particular of the tool half 3. The injection duct 16, or the injection ducts, respectively, are preferably heated to beyond 230 degrees Celsius, in particular depending on the size of the component, such that the material 12 is injected into the cavity 8 while the injection duct 16 has a temperature of more than 230 degrees Celsius. In the case of large components and long flow paths associated therewith, it is conceivable for the entire tool half 3 or 4, respectively, to be heated to beyond 230 degrees Celsius. In particular, the entire tool half 3 or 4, respectively, by way of which the material 12 is injected into the cavity 8 is heated in a corresponding manner.

The initially liquid tin melt is injected into the closed tool 2 at a pressure of 150 bar to 1500 bar. As soon as the tin melt has been distributed on the molding compound 5, or on a corresponding side of the molding compound 5, respectively, and starts to solidify, the temperature of the corresponding tool half 3 or 4, respectively, or the temperature of the injection duct 16, respectively, can be lowered such that a solidification of the molding compound 5 as well is of the initially liquid material 12 can be permitted, for example. The tool 2 is subsequently opened, and the component 1 can then be retrieved.

The connection between the molding compound 5, or the green product 9, respectively, and the layer 11 configured as a tin layer is achieved, for example, by micro-level mechanical interlocking. The tin melt, or the material 12, respectively, meets the not yet completely cured molding compound 5 and cools on the surface 13 of the latter. Since the molding compound 5 at the micro level is not a homogenous mass but on account of the at least one filler material 7, in particular in the not yet cured state of the molding compound 5, configures an at least substantially rough surface, the initially liquid tin melt can interlock in or with, respectively, the surface 13.

In the method, the molding compound 5 is coated with the material 12 only on that side onto which the material 12 is injected into the tool 2, for example. On account of the injection pressure representing a positive pressure at which the material 12 is injected into the cavity 8, the molding compound 5 is pushed toward the opposite tool half 4 or 3, respectively, and is thus sealed in relation to the surrounding flow of the material 12. For example, if it is envisaged that the molding compound 5 is coated not only on sides of the tool half 3 but also on sides of the opposite tool half 4, in each case at least one injection duct 16 by way of which the material 12 can be injected into the cavity 8 is accordingly provided in the tool half 3 as well is in the tool half 4.

On account of the electromagnetic shielding effected by the layer 11, the component 1, or the interior thereof, respectively, can be protected against electric and/or magnetic fields from the environment, for example, and/or the environment can be protected from electric and/or magnetic fields from the component 1. Since the material 12 is applied to the surface 13 while the molding compound 5 is situated in the tool 2, and without the molding compound 5 being retrieved from the tool 2, the molding compound 5 can be provided with the shielding mentioned in a particularly simple and cost-effective manner.

LIST OF REFERENCE CHARACTERS

1 Component
2 Tool
3 Tool half
4 Tool half
5 Molding compound
6 Artificial resin
7 Filler material
8 Cavity
9 Green product
10 Sub-region
11 Layer
12 Material
13 Surface
14 Arrow
15 Main body
16 Infeed duct The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for producing a component, comprising the acts of:
    incorporating a molding compound into a tool for producing the component, wherein the molding compound comprises an artificial resin as a matrix and a filler material embedded in the matrix;
    compressing the molding compound by the tool and by the compressing forming the molding compound to a green product; and
    providing the green product while disposed in the tool with a layer in a sub-region by incorporating a liquid material for producing the layer into the tool and applying the liquid material to the sub-region;
    wherein the liquid material is a metallic material and wherein the layer is an electromagnetic shielding on the green product.

2. The method according to claim 1, wherein the metallic material is pure metal.

3. The method according to claim 2, wherein the pure metal is pure tin.

4. The method according to claim 1, wherein the metallic material is initially mixed with an auxiliary material which is dissimilar to the metallic material and wherein the auxiliary material evaporates from the metallic material during and/or after solidification of the liquid material.

5. The method according to claim 1, wherein the layer is formed exclusively from the metallic material.

6. The method according to claim 1, wherein the liquid material is incorporated into the tool through an infeed duct of the tool and wherein the infeed duct is heated to a temperature which is higher than 200 degrees Celsius.

7. The method according to claim 1, wherein the liquid material is incorporated into the tool at a pressure which is in a range from 150 bar inclusive to 1500 bar inclusive.

8. The method according to claim 1, wherein the artificial resin is a thermosetting artificial resin.

9. The method according to claim 1, wherein the artificial resin is an unsaturated polyester resin.

10. The method according to claim 1, wherein the filler material includes reinforcement fibers.

11. The method according to claim 10, wherein the reinforcement fibers are glass fibers.

12. The method according to claim 1, wherein the filler material includes a mineral filler material.

13. The method according to claim 12, wherein the mineral filler material is chalk and/or rock flour.

14. The method according to claim 12, wherein a proportion of the mineral filler material in the molding compound is in a range from 15% inclusive to 45% inclusive.

15. The method according to claim 1, wherein the compressing is performed at a temperature which is in a range from 100 degrees Celsius inclusive to 180 degrees Celsius inclusive.

16. The method according to claim 1, wherein the compressing is performed at a pressure prevailing in the tool and acting on the molding compound which is in a range from 70 bar inclusive to 160 bar inclusive.

* * * * *